US011747055B2

(12) United States Patent
Ladner

(10) Patent No.: US 11,747,055 B2
(45) Date of Patent: Sep. 5, 2023

(54) PELTIER COOLING SYSTEM FOR A DOMESTIC KITCHEN APPLIANCE

(71) Applicants: BSH Home Appliances Corporation, Irvine, CA (US); BSH Hausgeräte GmbH, Munich (DE)

(72) Inventor: Robert Ladner, Knoxville, TN (US)

(73) Assignees: BSH Home Appliances Corporation, Irvine, CA (US); BSH Hausgeräte GMBH, Munich (DE)

( * ) Notice: Subject to any disclaimer, the term of this patent is extended or adjusted under 35 U.S.C. 154(b) by 1302 days.

(21) Appl. No.: 16/217,438

(22) Filed: Dec. 12, 2018

(65) Prior Publication Data
US 2020/0191450 A1    Jun. 18, 2020

(51) Int. Cl.
F25B 21/02 (2006.01)
F24C 3/12 (2006.01)
F24C 7/08 (2006.01)
F24C 15/00 (2006.01)
H10N 10/13 (2023.01)
H10N 10/80 (2023.01)

(52) U.S. Cl.
CPC ............... *F25B 21/02* (2013.01); *F24C 3/12* (2013.01); *F24C 7/08* (2013.01); *F24C 15/00* (2013.01); *H10N 10/13* (2023.02); *H10N 10/80* (2023.02); *F25B 2321/025* (2013.01); *F25B 2321/0212* (2013.01)

(58) Field of Classification Search
CPC .............. F25B 21/02; F25B 2321/0212; F25B 2321/025; F24C 15/006; F24C 15/322
See application file for complete search history.

(56) References Cited

U.S. PATENT DOCUMENTS 4,355,521 A * 10/1982 Tsai ................... F25B 29/003
                                                          62/196.4
4,884,626 A * 12/1989 Filipowski .............. F25D 23/12
                                                            165/265
(Continued)

FOREIGN PATENT DOCUMENTS

| EP | 2306535 A2 | 4/2011 |
| JP | H0571743 A | 3/1993 |
| JP | 2003299435 A | 10/2003 |

OTHER PUBLICATIONS

National Search Report EP 19 21 4969 dated May 12, 2020.

*Primary Examiner* — Ana M Vazquez
(74) *Attorney, Agent, or Firm* — Michael E. Tschupp; Brandon G. Braun; Andre Pallapies

(57) ABSTRACT

A domestic kitchen appliance is provided. The domestic kitchen appliance includes a peltier device having a hot side and a cold side; a hot-side heat-sink attached to the hot side of the peltier device, the hot-side heat-sink configured to remove heat from the hot side of the peltier device and transfer the heat removed from the hot side of the peltier device to a cooking chamber; a cold-side heat-sink attached to the cold side of the peltier device, the cold-side heat-sink fluidly connected to an area to be cooled; and a voltage supply that supplies voltage to the peltier device to cause the peltier device to absorb heat from the cold-side heat-sink into the cold side of the peltier device and to expel heat from the hot side of the peltier device into the hot-side heat-sink. The area to be cooled is outside of the cooking chamber.

14 Claims, 5 Drawing Sheets

(56) References Cited

U.S. PATENT DOCUMENTS

| | | | |
|---|---|---|---|
| 6,278,098 B1 * | 8/2001 | Han | F25D 23/12 |
| | | | 219/757 |
| 6,279,464 B1 | 8/2001 | Lo et al. | |
| 9,463,080 B2 | 10/2016 | Miller | |
| 9,976,750 B1 | 5/2018 | Kestner et al. | |
| 10,024,544 B2 | 7/2018 | Bhogal et al. | |
| 2004/0222212 A1 | 11/2004 | Yang | |
| 2005/0005612 A1 | 1/2005 | Kennedy | |
| 2005/0034716 A1 | 2/2005 | Harbin | |
| 2008/0245352 A1 | 10/2008 | Solechi et al. | |
| 2017/0074522 A1 | 3/2017 | Cheng | |
| 2017/0156347 A1 | 6/2017 | Reese et al. | |

\* cited by examiner

PELTIER COOLING SYSTEM FOR A DOMESTIC KITCHEN APPLIANCE

FIELD OF THE INVENTION

The invention is directed to a domestic cooking appliance. More particularly, embodiments of the invention are directed to a cooling system for a domestic cooking appliance that uses a peltier device.

An example of an application for the invention is a domestic kitchen cooking appliance in which a peltier device is used to reduce the temperature of cooling air that is circulated to cool spaces in the appliance.

BACKGROUND OF THE INVENTION

Some modern domestic kitchens include cooking appliances such as, for example, ranges, stoves, and cooktops. In many of these kitchens, cooking appliances or other appliances that produce heat are installed in cabinets or other configurations in which the surrounding environment has a limited tolerance to heat. In some situations, regulations limit the temperature of particular portions of kitchen appliances. In some appliances, control electronics or other elements of the appliances have maximum allowable temperatures.

Applicants recognized an improvement to the above arrangements and implement those improvements in embodiments of the invention.

SUMMARY

The invention achieves the benefit of providing adequate cooling to areas of kitchen appliances while, in some case, reducing the size of circulation fans.

Embodiments of the invention are based on the inventor's recognition that a Peltier device can be used in particular ways to provide adequate cooling to a kitchen appliance while simultaneously reducing the size of a fan that circulates the cooled air.

Particular embodiments of the invention are directed to a domestic kitchen appliance having a cooking chamber and an area to be cooled. The domestic kitchen appliance includes a peltier device having a hot side and a cold side; a hot-side heat-sink attached to the hot side of the peltier device, the hot-side heat-sink configured to remove heat from the hot side of the peltier device and transfer the heat removed from the hot side of the peltier device to the cooking chamber; a cold-side heat-sink attached to the cold side of the peltier device, the cold-side heat-sink fluidly connected to the area to be cooled; and a voltage supply that supplies voltage to the peltier device to cause the peltier device to absorb heat from the cold-side heat-sink into the cold side of the peltier device and to expel heat from the hot side of the peltier device into the hot-side heat-sink. The area to be cooled is outside of the cooking chamber.

In some embodiments, a cold-side fan is provided to circulate air around the cold-side heat sink.

In some embodiments, an exhaust duct having an exhaust outlet is provided, and the cold-side fan moves the air through the exhaust duct and out of the exhaust outlet.

In some embodiments, an opening is provided in the exhaust duct, the opening fluidly connecting the area to be cooled with the exhaust duct, and the second fan draws the air from the area to be cooled, through the opening, and into the exhaust duct.

Other embodiments of the invention are directed to a domestic kitchen appliance for heating a food heating vessel. The domestic kitchen appliance includes a thermally conductive heating plate having a heating side configured to contact the food heating vessel and an opposite side, the opposite side being on a side of the heating plate opposite to the heating side; an area to be cooled, the area to be cooled being adjacent the opposite side of the heating plate; a peltier device having a hot side and a cold side, the hot side being attached to the opposite side of the heating plate such that heat is transferred from the hot side to the heating plate; a cold-side heat-sink attached to the cold side of the peltier device, the cold-side heat-sink being fluidly connected to the area to be cooled; and a voltage supply that supplies voltage to the peltier device to cause the peltier device to absorb heat from the cold-side heat-sink into the cold side of the peltier device and to expel heat from the hot side of the peltier device into the heating plate.

Other embodiments of the invention are directed to a method of cooling an area to be cooled in a domestic kitchen appliance, the domestic kitchen appliance having a cooking chamber separate from the area to be cooled. The method includes providing a peltier device having a hot side and a cold side; removing heat from the hot side of the peltier device and transferring the heat removed from the hot side of the peltier device to the cooking chamber through a hot-side heat-sink attached to the hot side of the peltier device; absorbing heat from the area to be cooled through a cold-side heat-sink attached to the cold side of the peltier device, the cold-side heat-sink fluidly connected to the area to be cooled; and supplying voltage to the peltier device to cause the peltier device to absorb heat from the cold-side heat-sink into the cold side of the peltier device and to expel heat from the hot side of the peltier device into the hot-side heat-sink.

BRIEF DESCRIPTION OF THE DRAWINGS

The following figures form part of the present specification and are included to further demonstrate certain aspects of the disclosed features and functions, and should not be used to limit or define the disclosed features and functions. Consequently, a more complete understanding of the exemplary embodiments and further features and advantages thereof may be acquired by referring to the following description taken in conjunction with the accompanying drawings, wherein.

DETAILED DESCRIPTION

The invention is described herein with reference to the accompanying drawings in which exemplary embodiments of the invention are shown. The invention may, however, be embodied in many different forms and should not be construed as limited to the embodiments set forth herein.

As explained above, some modern domestic kitchens include cooking appliances such as, for example, ranges, stoves, wall ovens, and cooktops. In many of these kitchens, cooking appliances or other appliances that produce heat are installed in cabinets or other configurations in which the surrounding environment has a limited tolerance to heat. In some situations, regulations limit the temperature of particular portions of kitchen appliances. In some appliances, control electronics or other elements of the appliances have maximum allowable temperatures. Embodiments of the invention are based on the inventor's recognition that a Peltier device can be used in particular ways to provide adequate cooling to a kitchen appliance while simultaneously reducing the size of a fan that circulates the cooled air.

Figure 1:
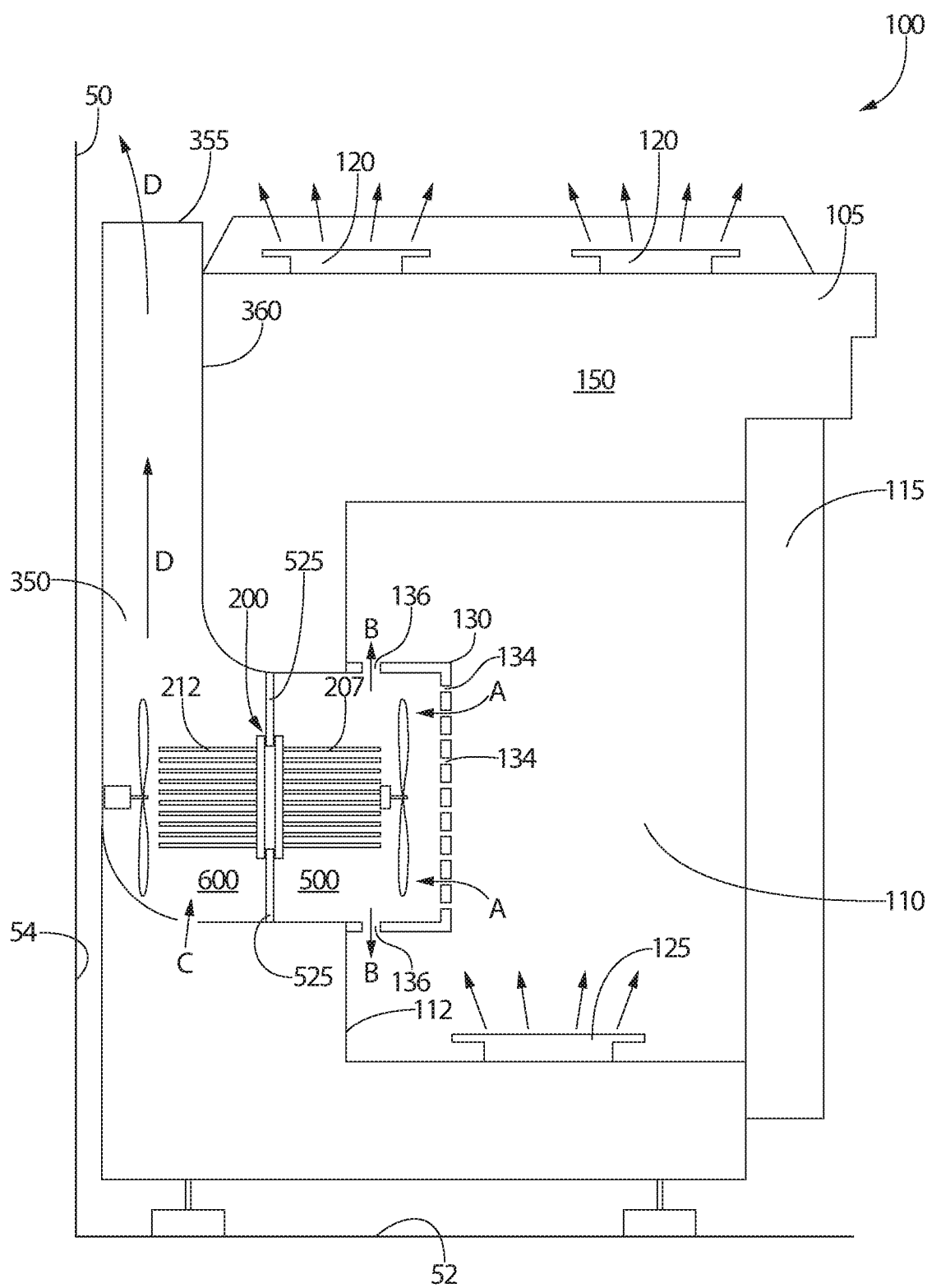
FIG. 1 is a schematic view of an exemplary appliance in accordance with embodiments of the invention.

FIG. 1 shows an example of a kitchen appliance 100, in this case a range, in accordance with embodiments of the invention. Applicant notes that the figures are schematic in nature and are not drawn to scale. Various features are depicted larger relative to other features for clarity purposes even though their actual relative sizes are different. Kitchen appliance 100 has a housing 105 that includes a cooking chamber 110 in which food items are heated and/or cooked. Cooking chamber 110 is accessed through a closable door 115. In this example, one heating element 125 is shown inside cooking chamber 110 to provide heat to cooking chamber 110. In some examples, heating element 125 is one or more gas burners, one or more electric elements, one or more other types of elements that provide heat or heating energy to cooking chamber 110, or any combination of these. This example of kitchen appliance 100 includes an upper cooking area that includes one or more heating elements 120. In some examples, heating elements 120 are gas burners, electric elements, other types of elements that provides heat or heating energy, or any combination of these. In this example, kitchen appliance 100 is positioned in a cabinet 50 having a floor 52 and a backwall 54. In other examples, kitchen appliance 100 is positioned between two cabinets or installed in some other configuration.

Some cooking appliances have exhaust ducts that exhaust gases from the cooking chamber to the environment outside of the appliance. For clarity, that type of exhaust duct is not addressed in detail in this disclosure.

The exhaust ducts referred to with respect to embodiments of the invention are exhaust ducts that channel air from spaces (such as, for example, area to be cooled 150) in the cooking appliance that are outside of the cooking chamber. Often such spaces are heated by heat transferred through walls of the cooking chamber, or other heat producing areas, into the spaces. In some cases, the exhaust duct is positioned as an insulating feature between a heated space and the exterior of the appliance such as, for example, a rear wall of housing 105. Such an insulating feature provides, for example, a desired temperature reduction in the housing where it is adjacent to backwall 54 of cabinet 50.

In some embodiments, a duct is provided to channel air from a cooler area in the appliance to a hotter area in the appliance. In such examples, it is beneficial to have a cooler source of air to channel to the hotter areas. Embodiments of the invention provide cooler air to the hotter areas by cooling the air in the duct.

In the example shown in FIG. 1, kitchen appliance 100 is a range that has an exhaust duct 350 that extends horizontally rearward from behind cooking chamber 110 and then vertically at the back side of housing 105. Other examples of embodiments of the invention are wall ovens or other cooking appliances. In this example, exhaust duct 350 opens to the environment at an exhaust outlet 355. Exhaust duct 350 has an exhaust duct wall 360 that separates exhaust duct 350 from area to be cooled 150. In this example, exhaust duct 350 acts as an insulating barrier between area to be cooled 150 and the back wall of housing 105 such that the temperature of the back wall of housing 105 is lower than it would be if exhaust duct 350 did not exist in this location. In the example shown in FIG. 1, area to be cooled 150 is heated by heat transferred from cooking chamber 110 and/or heating elements 120. In some embodiments, area to be cooled 150 (or an area adjacent to area to be cooled 150) contains control electronics or other temperature sensitive equipment that must be maintained at or below a particular temperature. Embodiments of the invention provide cooling to areas such as area to be cooled 150.

In the example shown in FIG. 1, air from area to be cooled 150 is drawn into exhaust duct 350 through one or more apertures in a wall of exhaust duct 350 (arrow C). The location of the aperture shown in FIG. 1 is just one possible example and it is noted that apertures can be provided in any size, number and location in the walls of exhaust duct 350. In this example, cooling of area to be cooled 150 is accomplished in two ways: warm air C is drawn out of area to be cooled 150; and heat from area to be cooled 150 is transferred through exhaust duct wall 360 (and/or through other parts of exhaust duct 350) into exhaust duct 350. Other examples include a plurality of ducts, or duct sections, that extend to different sections of housing 105 to remove heat from those sections in order to, for example, reduce the temperature of an external surface of kitchen appliance 100.

Embodiments of the invention use a Peltier device 200 to provide cooling to the air in exhaust duct 350 or other cooling duct. As discussed above, some embodiments include a duct to channel air form a cooler area in the appliance to a hotter area in the appliance. In such examples, a Peltier device is used to cool the air in the duct so that cooler air is supplied to the hotter areas in the appliance.

Figure 2:
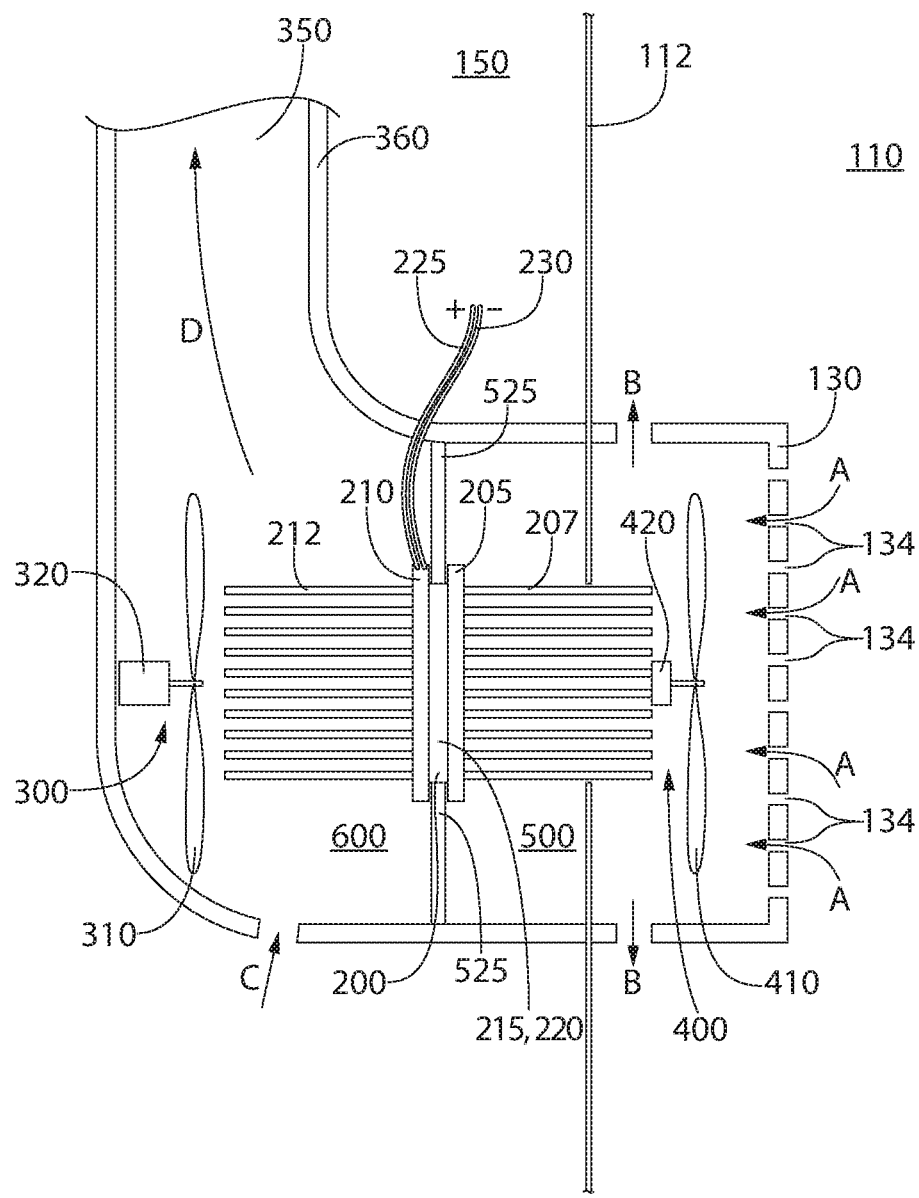
FIG. 2 is a schematic view of a cooling device in accordance with exemplary embodiments of the invention.

FIG. 2 shows Peltier device 200 and its surrounding features in more detail. Peltier device 200 will be described with reference to FIG. 4.

Figure 4:
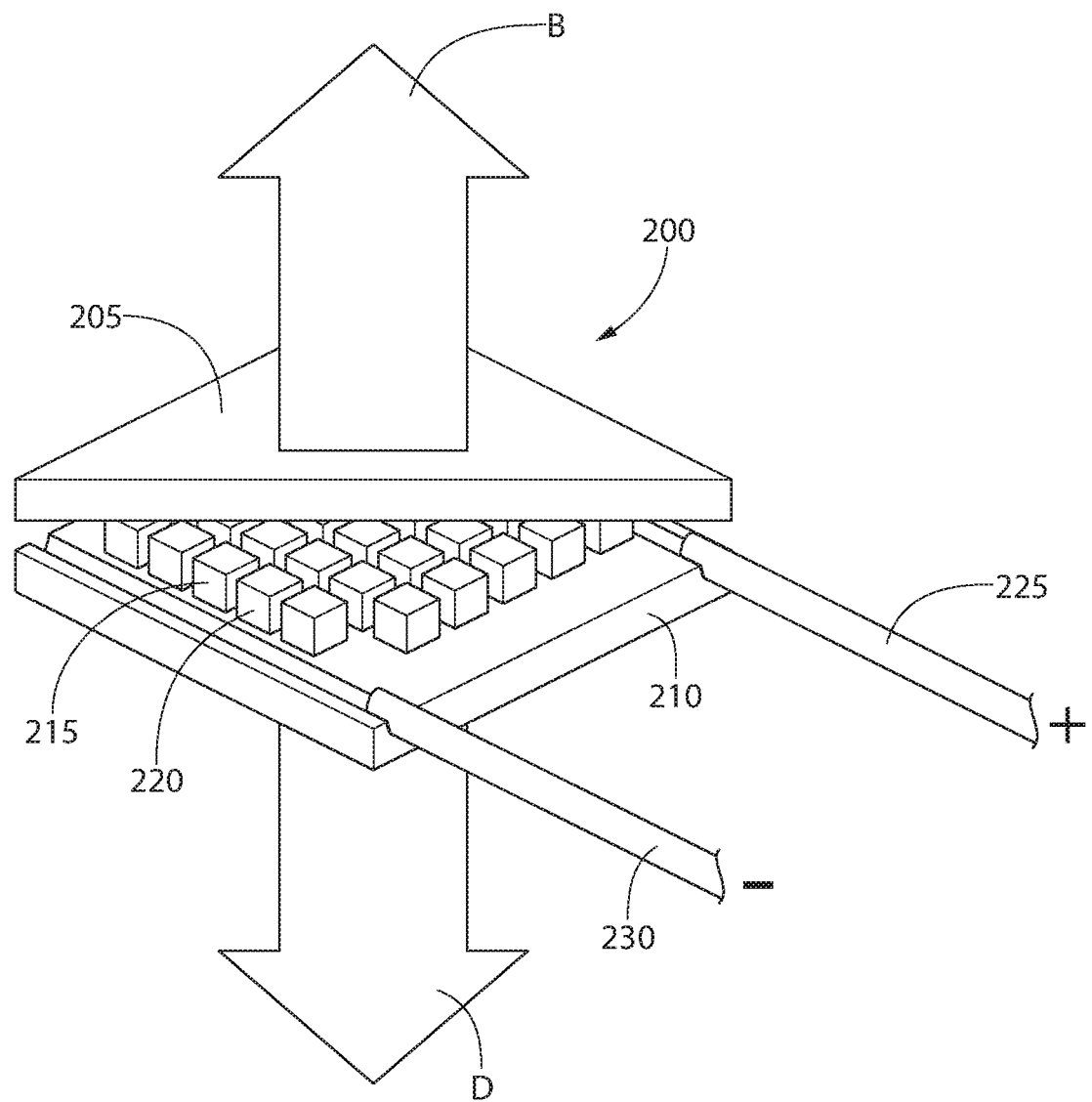
FIG. 4 is a perspective view of an example of a peltier device in accordance with embodiments of the invention.

A peltier device uses the Peltier effect to create a heat flux between the junction of two different types of materials. In this example, Peltier device 200 is a solid-state active heat pump which transfers heat from one side of the device (the cold side) to the other (the hot side), with consumption of electrical energy. In the example shown in FIG. 4, Peltier device 200 has a hot side 205 and a cold side 210. Between hot side 205 and cold side 210 are a number of P-type semiconductor pellets 215 and a number of N-type semiconductor pellets 220 that are connected to an electrical current by way of a positive electrical lead 225 and a negative electrical lead 230. When an electrical current is provided to Peltier device 200 through electrical leads 225, 230, Peltier device 200 expels heat from hot side 205 (represented by arrow B) and produces cooling (absorbs heat) at cold side 210 (represented by arrow D). While FIG. 4 shows one example of a Peltier device in accordance with embodiments of the invention, it is noted that any other appropriate Peltier device or other heat transferring device can be used.

Referring back to FIGS. 1 and 2, Peltier device 200 is, in this example, positioned in a partition 525 that fluidly separates a hot zone 500 from a cold zone 600. In embodiments, partition 525 is a thermal barrier that resists heat transfer from hot zone 500 to cold zone 600. Partition 525 helps prevent heat expelled from hot side 205 of Peltier device 200 (and heat generated in cooking chamber 110) from being transferred to cold zone 600.

In the example shown, a cold-side heat-sink 212 is attached to cold side 210 of Peltier device 200. Cold-side heat-sink 212 promotes heat transfer from cold zone 600 into cold side 210 of Peltier device 200. In this example, a cold-side fan 300 is provided to increase air circulation around cold-side heat-sink 212 in order to further promote heat transfer from cold zone 600 into cold side 210 of Peltier device 200. Cold-side fan 300 is, in this example, an axial fan having a motor 320 that moves blades 310 to pull air C from outside of exhaust duct 350, over cold-side heat-sink 212, through exhaust duct 350, and out of exhaust outlet 355. The location and position of cold-side fan 300 is schematic in nature and it is noted that cold-side fan 300 can be located and positioned differently than what is shown in the figures in order to promote the desired air circulation. In addition, fans other than axial fans can be used.

In the example shown, a hot-side heat-sink 207 is attached to hot side 205 of Peltier device 200. Hot-side heat-sink 207 promotes heat transfer from hot side 205 of Peltier device 200 to hot zone 500. In this example, a hot-side fan 400 is provided to increase air circulation around hot-side heat-sink 207 in order to further promote heat transfer from hot side 205 of Peltier device 200. Hot-side fan 400 is, in this example, an axial fan having a motor 420 that moves blades 410 to pull air A from outside of a shroud 130, through apertures 134, over hot-side heat-sink 207, and out of shroud 130 through apertures 136 (arrows B) (labeled in FIG. 1). The location and position of hot-side fan 400 is schematic in nature and it is noted that hot-side fan 400 can be located and positioned differently than what is shown in the figures in order to promote the desired air circulation. In addition, fans other than axial fans can be used.

Motor 320 of cold-side fan 300 is shown as being attached to a wall of exhaust duct 350. In other embodiments, motor 320 is attached to cold-side heat-sink 212 or to some other structure. Motor 420 of hot-side fan 400 is shown as being attached to hot-side heat-sink 207. In other embodiments, motor 420 is attached to shroud 130 or to some other structure.

In both of the examples shown in FIGS. 1 and 2, shroud 130 extends into cooking chamber 110 and covers hot-side fan 400. In other embodiments, shroud 130 is aligned with a back wall 112, or some other wall, of cooking chamber 110. In other embodiments, shroud 130 is recessed into back wall 112, or some other wall, of cooking chamber 110. In FIGS. 1 and 2, shroud 130 is shown having a plurality of apertures 134 that fluidly connect cooking chamber 110 with an area inside shroud 130. Apertures 134 permit air from cooking chamber 110 to pass over hot-side heat-sink 207 to promote heat transfer from hot-side heat-sink 207 (and hot side 205 of Peltier device 200) to cooking chamber 110. In other embodiments, for example the embodiment shown in FIG. 5, shroud 130 has no apertures 134.

In the example shown in FIG. 1, back wall 112 of cooking chamber 110 does not extend into hot zone 500. In contrast, in the example shown in FIG. 2, back wall 112 of cooking chamber 110 extends into hot zone 500 and creates a partial thermal barrier between partition 525 and shroud 130. The temperature of hot side 205, the temperature in cooking chamber 110, and the desired heat transfer from hot side 205 to cooking chamber 110 are all factors in whether it is more desirable to not extend back wall 112 as shown in FIG. 1 or to extend back wall 112 as shown in FIG. 2.

Figure 3:
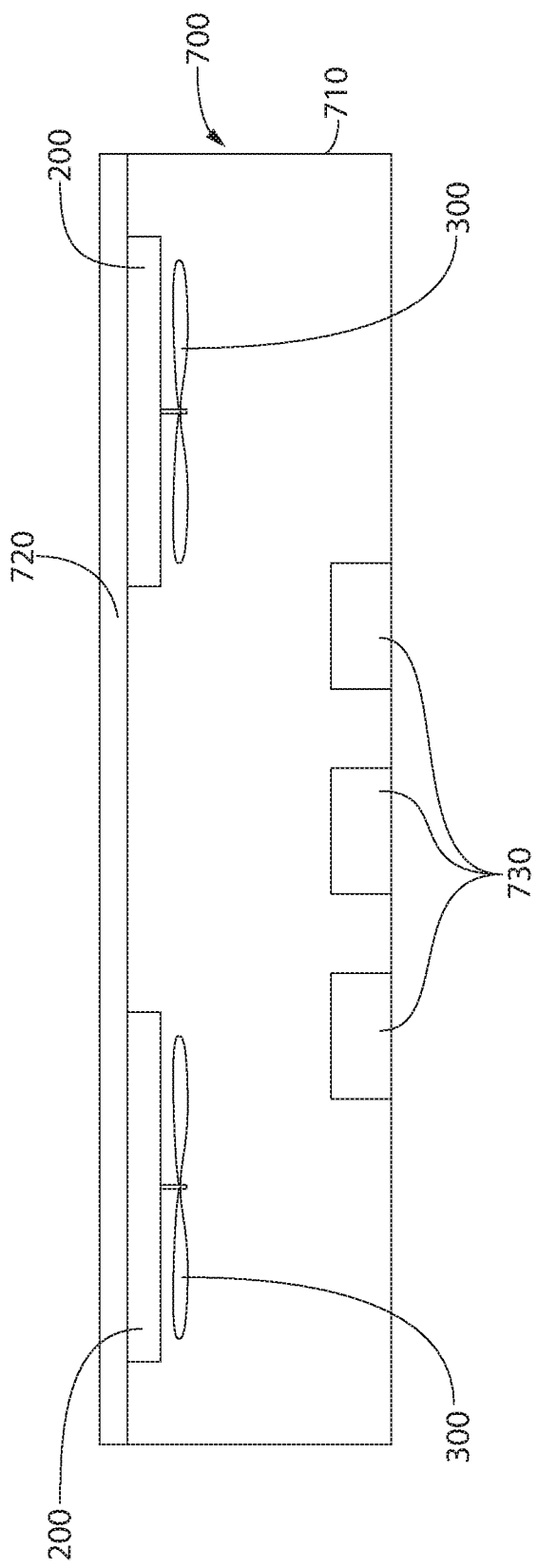
FIG. 3 is a partial perspective view of a cooktop in accordance with exemplary embodiments of the invention.

FIG. 3 shows a cooktop 700 in accordance with exemplary embodiments of the invention. In this example, cooktop 700 has a heating plate 720 that is, for example, a glass-ceramic plate that is located above heating units (not shown) to provide heating energy to a cooking vessel placed on heating plate 720. Cooktop 700 has a housing 710 that contains control (or other) electronics 730 and/or other temperature sensitive elements. It is desirable to limit the temperature of the air in housing 710 so that electronics 730 are not subjected to damaging temperatures. In this example, two Peltier devices 200 are provided to reduce the temperature in housing 710. In this example, each Peltier device 200 has its cold side 210 facing away from heating plate 720 and cold-side fan 300 circulating air around cold side 210 to promote heat transfer from the air in housing 710 to Peltier device 200. Each Peltier device 200 has its hot side 205 attached, in this example, directly to the underside of heating plate 720 so that heating plate 720 acts as a hot-side heat-sink to draw heat away from Peltier device 200. This configuration provides heat from Peltier devices 200 to heating plate 720 to, in some examples, supplement heat provided by heating plate 720 to a cooking vessel.

Figure 5:
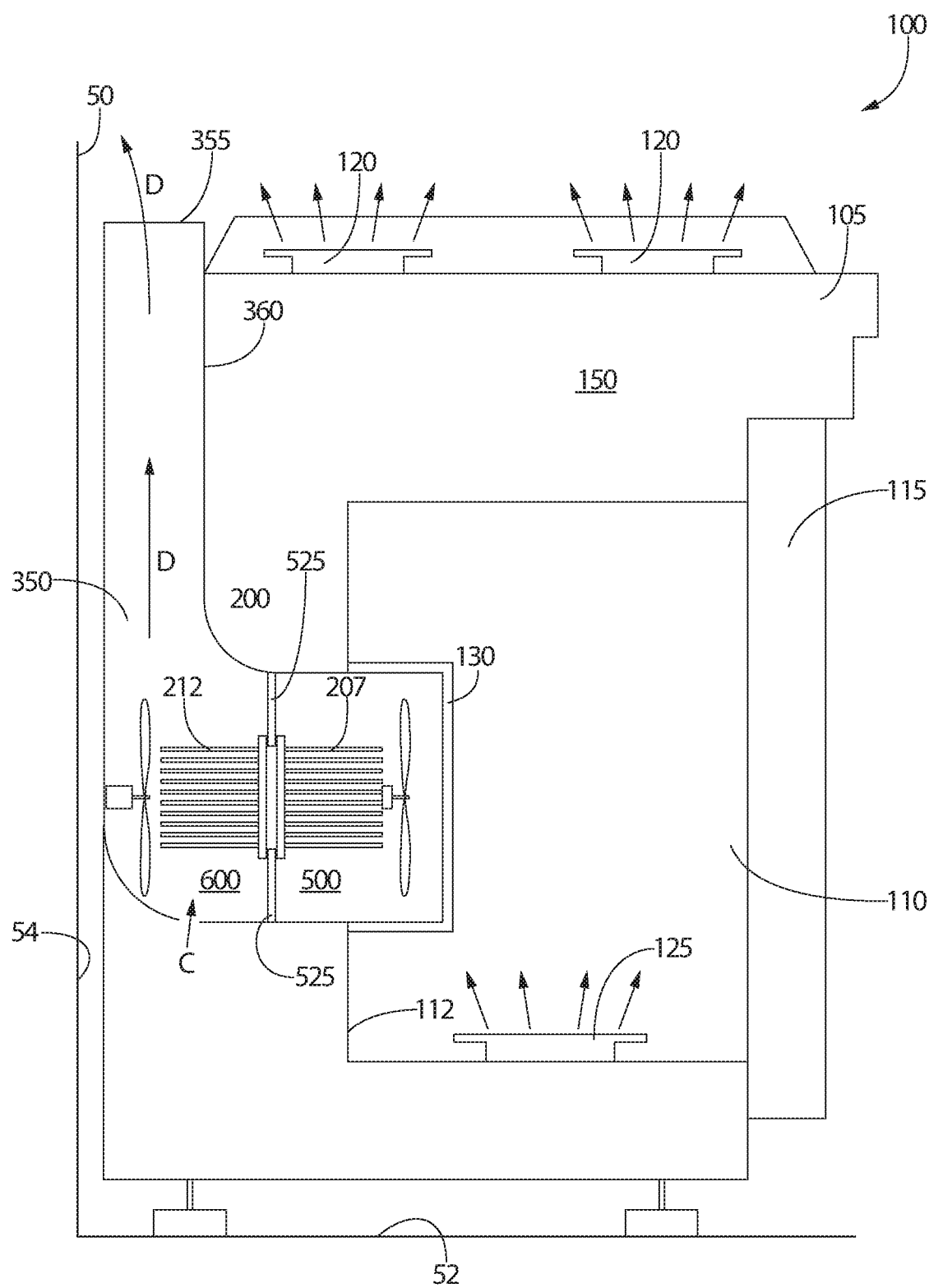
FIG. 5 is a schematic view of an exemplary appliance in accordance with embodiments of the invention.

FIG. 5 shows an example of kitchen appliance 100 in accordance with embodiments of the invention. In this example, as mentioned above, shroud 130 is solid and has no apertures 134. In some applications, it is desirable for shroud 130 to act as a heat-emitting structure that emits radiant heat instead of having hot air blowing from apertures 134. In the example shown in FIG. 5, shroud 130 extends into cooking chamber 110 and covers hot-side fan 400. In other embodiments, shroud 130 is aligned with back wall 112, or some other wall, of cooking chamber 110. In other embodiments, shroud 130 is recessed into back wall 112, or some other wall, of cooking chamber 110.

In embodiments, shroud 130 has one or more apertures 134 that are located around a perimeter of shroud 130 (for example, in the top and bottom surfaces of shroud 130 in the Figures) or at some other location on shroud 130. Shroud 130 can be square, rectangular, round, oval, donut-shaped, or any other shape that provide the desired heat transfer between hot side 205 of Peltier device 200 and cooking chamber 110. For example, shroud 130 can have a central portion that is co-planar with back wall 112 and an outside (radially) portion that extends into cooking chamber 110 to create a donut-shaped heated ring that extends into cooking chamber 110. In embodiments, this donut-shaped heating ring surrounds a convection fan in a convection oven.

It will be appreciated that variants of the above-disclosed and other features and functions, or alternatives thereof, may be combined into many other different systems or applications. Any of the features described above can be combined with any other feature described above as long as the combined features are not mutually exclusive. Various presently unforeseen or unanticipated alternatives, modifications, variations or improvements therein may be subsequently made by those skilled in the art which are also intended to be encompassed by the invention.

What is claimed is:

1. A domestic kitchen appliance having a cooking chamber and an area to be cooled, the domestic kitchen appliance comprising:
   a peltier device having a hot side and a cold side;
   a hot-side heat-sink attached to the hot side of the peltier device, the hot-side heat-sink configured to remove heat from the hot side of the peltier device and transfer the heat removed from the hot side of the peltier device to the cooking chamber;
   a cold-side heat-sink attached to the cold side of the peltier device, the cold-side heat-sink fluidly connected to the area to be cooled;

a cold-side fan configured to circulate air around the cold-side heat-sink;

an exhaust duct having an exhaust outlet outside of the area to be cooled, the exhaust outlet being located at an end of the exhaust duct that contacts an environment outside of the appliance; and a voltage supply that supplies voltage to the peltier device to cause the peltier device to absorb heat from the cold-side heat-sink into the cold side of the peltier device and to expel heat from the hot side of the peltier device into the hot-side heat-sink, wherein the area to be cooled is outside of the cooking chamber; and the cold-side fan moves the air through the exhaust duct and out of the exhaust outlet.

2. The domestic kitchen appliance of claim 1, further comprising an insulating partition located between the hot side of the peltier device and the cold side of the peltier device, the insulating partition separating air that contacts the hot-side heat-sink from air that contacts the cold-side heat-sink.

3. The domestic kitchen appliance of claim 2, further comprising a hot-side fan configured to circulate air around the hot-side heat-sink.

4. The domestic kitchen appliance of claim 1, further comprising an opening in the exhaust duct, wherein the opening fluidly connects the area to be cooled with the exhaust duct, and the cold-side fan draws the air from the area to be cooled, through the opening, and into the exhaust duct.

5. The domestic kitchen appliance of claim 1, wherein a wall of the exhaust duct is thermally conductive and transfers heat from the area to be cooled to an internal space of the exhaust duct.

6. The domestic kitchen appliance of claim 1, further comprising control electronics that control heating operations of the domestic kitchen appliance, wherein the control electronics are located in the area to be cooled.

7. The domestic kitchen appliance of claim 1, further comprising control electronics that control heating operations of the domestic kitchen appliance, wherein the control electronics are fluidly connected to the area to be cooled.

8. The domestic kitchen appliance of claim 1, further comprising a shroud that separates the hot-side heat-sink from the cooking chamber.

9. The domestic kitchen appliance of claim 8, wherein the shroud has a plurality of apertures that fluidly connect the hot-side heat-sink to the cooking chamber.

10. The domestic kitchen appliance of claim 8, wherein the shroud prevents air that contacts the hot-side heat-sink from entering the cooking chamber through the shroud.

11. A method of cooling an area to be cooled in a domestic kitchen appliance, the domestic kitchen appliance having a cooking chamber separate from the area to be cooled, the method comprising:

providing a peltier device having a hot side and a cold side;

removing heat from the hot side of the peltier device and transferring the heat removed from the hot side of the peltier device to the cooking chamber through a hot-side heat-sink attached to the hot side of the peltier device;

absorbing heat from the area to be cooled through a cold-side heat-sink attached to the cold side of the peltier device, the cold-side heat-sink fluidly connected to the area to be cooled;

circulating air around the cold-side heat-sink with a cold-side fan;

exhausting the air circulated around the cold-side heat sink from an exhaust duct having an exhaust outlet outside of the area to be cooled, the exhaust outlet being located at an end of the exhaust duct that contacts an environment outside of the appliance; and supplying voltage to the peltier device to cause the peltier device to absorb heat from the cold-side heat-sink into the cold side of the peltier device and to expel heat from the hot side of the peltier device into the hot-side heat-sink.

12. The method of claim 11, separating air that contacts the hot-side heat-sink from air that contacts the cold-side heat-sink with an insulating partition located between the hot side of the peltier device and the cold side of the peltier device.

13. The method of claim 11, further comprising circulating air around the hot-side heat-sink with a hot-side fan.

14. The method of claim 11, further comprising drawing, by the cold-side fan, air into the exhaust duct from the area to be cooled through an opening that fluidly connects the area to be cooled with the exhaust duct.

* * * * *